United States Patent
Christenson et al.

(10) Patent No.: US 8,142,571 B2
(45) Date of Patent: Mar. 27, 2012

(54) PROCESS FOR TREATMENT OF SEMICONDUCTOR WAFER USING WATER VAPOR CONTAINING ENVIRONMENT

(75) Inventors: Kurt K. Christenson, Minnetonka, MN (US); David DeKraker, Burnsville, MN (US)

(73) Assignee: FSI International, Inc., Chaska, MN (US)

( * ) Notice: Subject to any disclaimer, the term of this patent is extended or adjusted under 35 U.S.C. 154(b) by 166 days.

(21) Appl. No.: 12/436,465

(22) Filed: May 6, 2009

(65) Prior Publication Data

US 2009/0286334 A1  Nov. 19, 2009

Related U.S. Application Data

(63) Continuation-in-part of application No. 12/152,641, filed on May 15, 2008, now Pat. No. 7,819,984.

(60) Provisional application No. 61/119,581, filed on Nov. 18, 2008.

(51) Int. Cl.
*B08B 3/04* (2006.01)
*B08B 3/10* (2006.01)

(52) U.S. Cl. .................. 134/19; 134/30; 134/31

(58) Field of Classification Search ............ 134/19, 134/31
See application file for complete search history.

(56) References Cited

U.S. PATENT DOCUMENTS

| | | | |
|---|---|---|---|
| 5,203,956 | A | 4/1993 | Hansen |
| 6,332,724 | B1 | 12/2001 | Yano et al. |
| 6,406,551 | B1 | 6/2002 | Nelson et al. |
| 6,488,272 | B1 | 12/2002 | Nguyen |
| 6,598,805 | B2 * | 7/2003 | Hirae et al. ............ 239/128 |
| 6,616,773 | B1 | 9/2003 | Kuzumoto et al. |
| 6,837,252 | B2 | 1/2005 | Bergman |
| 2005/0011537 | A1 | 1/2005 | Toshima et al. |
| 2006/0156927 | A1 | 7/2006 | Udagawa et al. |
| 2007/0161248 | A1 | 7/2007 | Christenson et al. |
| 2007/0245954 | A1 | 10/2007 | Collins et al. |
| 2010/0124410 | A1 | 5/2010 | Benson |

OTHER PUBLICATIONS

International Search Report mailed Jun. 17, 2009, (2 pgs).

* cited by examiner

*Primary Examiner* — Michael Kornakov
*Assistant Examiner* — Natasha Campbell
(74) *Attorney, Agent, or Firm* — Kagan Binder, PLLC

(57) ABSTRACT

A process is provided for treating a semiconductor wafer at a target wafer temperature. This process includes the following steps:
a) determining the target wafer temperature of the semiconductor wafer during a given wafer treatment process step;
b) providing a treatment chamber having at least one semiconductor wafer disposed therein;
c) dispensing water vapor into the treatment chamber in an amount to provide the chamber with an atmospheric environment having a dew point sufficiently close to the target wafer temperature to provide a temperature regulating effect; and
d) initiating the given wafer treatment process step when the atmospheric environment of the treatment chamber is at the dew point of step c).

14 Claims, 3 Drawing Sheets

1/28 APM Oxide Etch Summary
Center chem dispense

PROCESS FOR TREATMENT OF SEMICONDUCTOR WAFER USING WATER VAPOR CONTAINING ENVIRONMENT

This application is a continuation in part of U.S. Application Serial No. 12/152,641 filed on May 15, 2008 now U.S. Pat. No. 7,819,984 and claims the benefit of U.S. Provisional Application Ser. No. 61/199,581 filed on Nov. 18, 2008, entitled "PROCESS FOR TREATMENT OF SEMICONDUCTOR WAFER USING WATER VAPOR CONTAINING ENVIRONMENT," which application is incorporated herein by reference in its entirety.

FIELD OF THE INVENTION

The present invention relates to a process for treatment of semiconductor wafers using a water vapor containing environment. More specifically, the present invention relates to a process whereby water vapor is dispensed into the treatment chamber to provide the chamber with a defined water vapor containing atmospheric environment.

BACKGROUND OF THE INVENTION

Advances in electronic technology cause integrated circuits to be formed on substrates such as silicon wafers with ever increasing packing density of active components. The formation of circuits is carried out by sequential application, processing, and selective removal of various components from the substrate.

At times it is desirable to deliver steam to the semiconductor wafer treatment chamber as an aspect of the treatment process. U.S. Pat. No. 6,837,252 describes an apparatus for treating a workpiece with steam and ozone. The disclosure of this patent describes alternative configurations, whereby liquid is dispensed into the chamber, as shown in FIG. 4 of the patent, and steam is dispensed as shown in FIG. 5 of the patent. As described therein, steam is generated by a steam generator or boiler. See column 15, lines 37-56.

In US Patent Application Publication No. 2007/0161248, various methods for introducing water vapor into a treatment chamber by generating the vapor outside of the treatment chamber were described at paragraph [0047]. Specifically, the disclosure stated that "For instance, externally produced water vapor could be supplied to the chamber as a gas, or as component of a mixture of gasses. In one embodiment, vapor could be produced by bubbling a gas (eg. $N_2$) through a column of water (preferably hot water). In another embodiment, the gas could pass over the surface of a quantity of water. In another embodiment, the gas could pass through an irrigated packed column as commonly used in chemical engineering. In another embodiment, substantially pure water vapor could be produced by boiling liquid water. The gaseous products from any of these alternatives could be further heated. Other embodiments are also possible."

It would be desirable to identify alternative techniques and systems for treatment of semiconductor wafers using water vapor.

SUMMARY OF THE INVENTION

It has been found that temperature sensitive semiconductor wafer treatment processes exhibit non-uniformity across the surface of the wafer for a variety of reasons, including heat transfer to the environment, evaporative cooling, and temperature differences between the wafer and the processing liquid (and the associated non-uniform heating/cooling profile).

In the present invention, the temperature differences across a surface of a wafer are minimized by utilizing a unique process for treating a semiconductor wafer at a target wafer temperature. In the present invention, a process is provided for treating a semiconductor wafer at a target wafer temperature. This process includes the following steps:

a) determining the target wafer temperature of the semiconductor wafer during a given wafer treatment process step;

b) providing a treatment chamber having at least one semiconductor wafer disposed therein;

c) dispensing water vapor into the treatment chamber in an amount to provide the chamber with an atmospheric environment having a dew point sufficiently close to the target wafer temperature to provide a temperature regulating effect; and d) initiating the given wafer treatment process step when the atmospheric environment of the treatment chamber is at the dew point of step c).

While not being bound by theory, it is believed that the temperature uniformity across the surface of the wafer is improved in the present process by one or more of the following phenomena:

Temperature control: By adding dispensing water vapor into the treatment chamber to provide an atmospheric environment having a dew point as specified, the saturation temperature (i.e. the temperature at which water starts to condense) of the environment can be set to the desired processing temperature. In this way, any cool spots on the wafer will tend to condense water from the humid environment, thereby raising the temperature of the initially cooler spot to the desired temperature.

Evaporation control: Because the atmospheric environment can be set as a humidified environment, wafer treatment compositions (or "chemistries") that are aqueous in nature will tend to stay on the wafer rather than being lost to evaporation. Likewise, the water in an aqueous chemistry in place on the wafer will only evaporate from any warm spots until the local temperature of the wafer drops to the dew point. Because evaporation is limited in embodiments of the present process, the associated cooling effects are avoided and the temperature of the wafer tends to remain more uniform.

When the dew point is sufficiently close to the temperature of the wafer, the evaporation and/or condensation of the water vapor imparts a temperature regulating effect.

The present invention provides an easy to use process that affords superior control of process conditions that can lead to excellent uniformity of process results.

BRIEF DESCRIPTION OF THE DRAWINGS

The accompanying drawings, which are incorporated in and constitute a part of this application, illustrate several aspects of the invention and together with a description of the embodiments serve to explain the principles of the invention. A brief description of the drawings is as follows.

DETAILED DESCRIPTION OF PRESENTLY PREFERRED EMBODIMENTS

Figure 1:
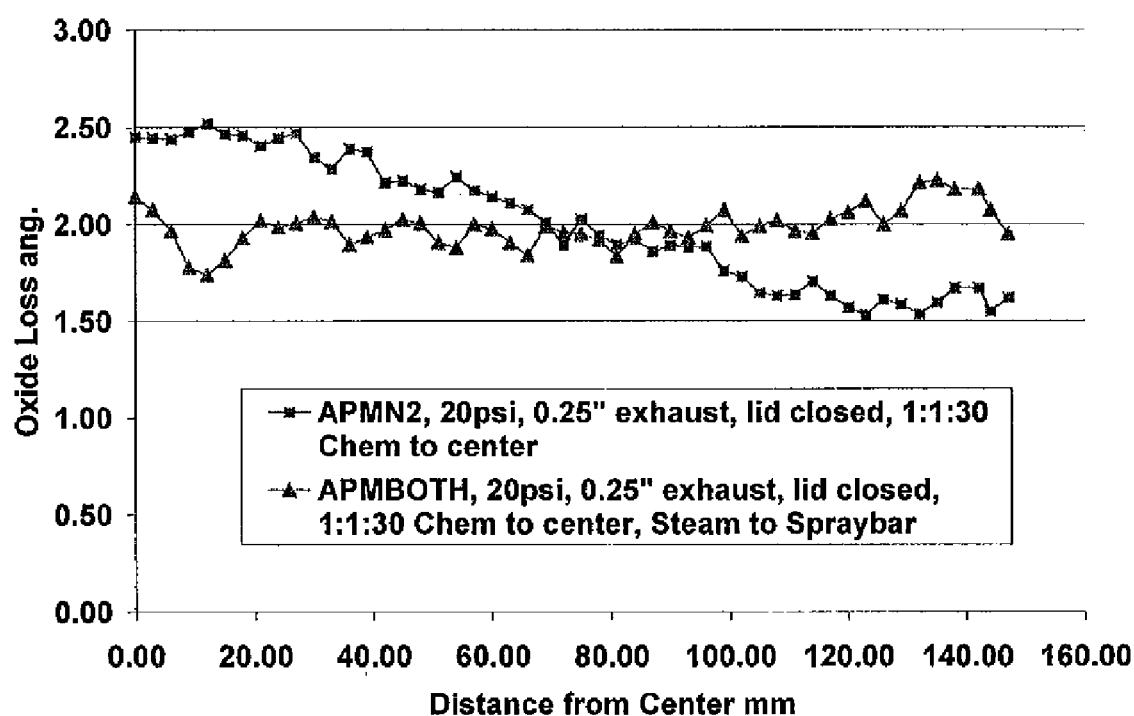
FIG. 1 is a graph showing uniformity evaluation across a wafer of processes carried out according to the present invention a compared to a control.

The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

In the process of the present invention, one first determines the target wafer temperature of the semiconductor wafer during a given wafer treatment process step. In typical wafer treatment processes, it is desirable to elevate the temperature of the wafer to a certain predetermined temperature to facilitate the desired interaction between the wafer and the treatment chemistry. It will be understood that it is possible to carry out a reaction within a certain range of temperatures. The skilled artisan when carrying out the process of the present invention may purposely select a single target temperature as a working point, or may defacto select this target temperature by establishing tool setting parameters for carrying out a process, thereby determining what the temperature will be as a target without actually identifying a measured temperature value.

A treatment chamber is provided having at least one semiconductor wafer disposed therein. The treatment chamber can be one designed to accommodate one semiconductor wafer at a time or a plurality of semiconductor wafers. In an embodiment, the treatment chamber is a spray processor. Spray processors have generally been known, and provide an ability to remove liquids with centrifugal force by spinning or rotating the wafer(s) on a turntable or carousel, either about their own axis or about a common axis. Exemplary spray processor machines suitable for adaptation in accordance with the present invention are described in U.S. Pat. Nos. 6,406,551 and 6,488,272, which are fully incorporated herein by reference in their entireties. Spray processor type machines are available from FSI International, Inc. of Chaska, Minn., e.g., under one or more of the trade designations MERCURY® or ZETA®. An example of a single-wafer spray processor system suitable for adaptation in accordance with the present invention is available from SEZ AG, Villach, Austria and sold under the trade designation SEZ 323. Another example of a tool system suitable for adaptation in accordance with the present invention is described in U.S. patent application Ser. No. 11/376,996, entitled BARRIER STRUCTURE AND NOZZLE DEVICE FOR USE IN TOOLS USED TO PROCESS MICROELECTRONIC WORKPIECES WITH ONE OR MORE TREATMENT FLUIDS, filed on Mar. 15, 2006; or as described in US Patent Application Publication No. 2005/0205115.

Once provided in the treatment chamber, the wafer can be optionally preheated to or near the above determined target wafer temperature using any appropriate technique, such as by heating the chamber using radiant heat, by introduction of hot water or other liquid solution to the wafer with optional substantial removal of the heated liquid prior to application of the treatment chemistry, and by introduction of heated gases to the chamber, and the like. In one embodiment of the present invention, the wafers can be preheated by submerging one or more wafers into a heated bath of liquid, quickly draining the contents of the bath (e.g. a "quickdump" procedure) and conducting the remaining treatment steps as described below. The bath liquid can be, for example, DI water, DI water containing sulfuric acid, sulfuric acid/hydrogen peroxide mixture, an inert fluid (such as a fluorocarbon), sulfuric acid/ozone mixture, and the like. This embodiment can provide substantial benefit in enhancing throughput of the treatment process by more efficiently heating the wafers. An example of a particularly suitable process system that can be used to employ this embodiment is the Magellan® system commercially available from FSI International, Chaska, Minn.

Water vapor is dispensed into the treatment chamber in an amount effective to provide the chamber with an atmospheric environment having a dew point at the target wafer temperature. For purposes of the present invention, water vapor is defined as water in the gaseous form, and distinguished from small droplets of water commonly called "mist." Because mist is water that is condensed in the form of small droplets, there is essentially no net warming effect when mist settles on a surface that would correspond to a heat of vaporization. For purposes of the present invention, steam is vaporized water at or above the boiling point of water, which depends on the pressure, e.g. 100° C. if the pressure is 1 atmosphere. When steam is provided at a temperature greater than the boiling point of water, is it called superheated steam. Water vapor optionally may be provided from compositions comprising components in addition to water, such as dissolved gasses such as ozone, or inert gasses such as nitrogen. It is contemplated that water vapor may be supplied to the treatment chamber in any manner, either essentially pure, or in compositions, either above, or below or at 100° C., and having pressures or partial pressures of water vapor either above, below or at 1 atm. The water vapor optionally may further comprise additional ingredients, such as an oxidizing agent as discussed above or components used for wafer cleaning including $NH_4OH$, sulfuric acid, HF, ammonium fluoride, $H_3PO_4$, HCl, peroxide, ozone and combinations thereof. Incorporation of other ingredients, such as surfactants, cosolvents, or the like, are additionally contemplated.

Water vapor may be provided by a steam generator or boiler as conventionally known in the semiconductor wafer treatment art. Optionally, the wafer vapor can be provided by using a water vapor dispenser system as described in U.S. Provisional Patent Application Ser. No 61/199,580, entitled SYSTEM FOR SUPPLYING WATER VAPOR IN SEMICONDUCTOR WAFER TREATMENT, filed Nov. 18, 2008, the disclosure of which is incorporated by reference herein for all purposes. This water vapor dispenser comprises i) a hot water source, ii) a water vapor separator, iii) a first conduit fluidly connecting the hot water source to the water vapor separator, iii) a fluid control valve in the first conduit controlling the flow of fluid between the hot water source and the water vapor separator, and iv) a second conduit fluidly connecting the water vapor separator to the treatment chamber for delivery of water vapor to the interior of the treatment chamber.

The dew point is the temperature to which the air would have to cool (at constant pressure and constant water vapor content) in order to reach saturation. The atmosphere of the treatment chamber is saturated when the air in the chamber is holding the maximum amount of water vapor possible at the existing temperature and pressure. Moisture will condense onto any surface that is at a temperature that is at or below the dew point thereby transferring energy to the surface.

The given wafer treatment process step is initiated when the atmospheric environment of the treatment chamber is at dew point sufficiently close to the target wafer temperature to provide a temperature regulating effect. In an embodiment, of the present invention, the dew point is within about 20° C. of the target wafer temperature. In another embodiment, the dew point is within about 10° C. of the target wafer temperature. In another embodiment, the dew point is within about 5° C. of the target wafer temperature. In another embodiment, the wafer treatment process step is initiated when the atmospheric environment of the treatment chamber is at the dew point at the target wafer temperature and when the wafer is at the target wafer temperature. In another embodiment, the wafer treatment process step is initiated when the temperature of the atmospheric environment of the treatment chamber is far removed from the target wafer temperature, but the temperature and dew point of the atmosphere move quickly toward the target wafer temperature (approaching the target temperature in a time that is short compared to the length of the treatment step). In other words, it is specifically contemplated that the wafer treatment process step may be initiated at some time before the treatment chamber reaches the desired atmospheric temperature and/or dew point, provided that the desired wafer treatment is carried out on a wafer(s) being imparted a temperature regulating effect during a portion of the treatment step.

The wafer treatment process step can be initiated when the wafer itself is above, below or at the target wafer temperature. When the wafer is above the target temperature range, the wafer will be in the process of cooling during the wafer treatment process. In an embodiment of the present invention, the wafer treatment process step is initiated when the wafer is at the target wafer temperature. When the wafer is below the target temperature range, the wafer will be in the process of heating up during the wafer treatment process. The present invention provides benefit in that embodiment by providing enhanced uniformity of temperature as the wafer heats up.

It has further been found that one can use the present process to tailor process uniformity. In a typical center dispense semiconductor wafer process where heated chemistry is applied directly to a preheated wafer, the wafer edge loses heat by evaporative cooling more rapidly than does the center. This can lead to a center-fast process. By spinning the wafer in a moist vapor environment (specifically, an environment where the dew point is near the temperature of the heated chemistry), the evaporation from the edge can be suppressed. Alternatively, a process may be carried out where heated chemistry is applied to a semiconductor wafer that has not been pre-heated to the temperature of the heated chemistry to be applied to the wafer. This process will be center fast because the wafer center heats up most quickly. If this process were instead performed in a high moisture vapor containing environment (specifically, an environment where the dew point is above the temperature of the heated chemistry), the vapor would tend to condense on the edge of the wafer, causing the edge to heat up. The spinning edge of the wafer would tend to heat more rapidly than other portions of the wafer, thereby counteracting the tendency to be a center-fast process.

The water vapor as dispensed in the treatment chamber may be provided in various amounts and temperatures. In an embodiment of the present invention, the dew point at the target wafer temperature is achieved by dispensing fully saturated water vapor into the treatment chamber until the dew point at the target wafer temperature within the treatment chamber is reached. In another embodiment, the dew point at the target wafer temperature is achieved by dispensing less than filly saturated water vapor into the treatment chamber until the dew point at the target wafer temperature within the treatment chamber is reached. The less than fully saturated water vapor may be provided by operating the water vapor source at less than full capacity to prepare a saturated environment, or may be operated at full capacity but diluted by a stream of non vapor fluid, such as an inert gas. In an embodiment, the water vapor comprises nitrogen gas.

In an embodiment of the present invention, the water vapor is provided as steam at a temperature of about 100° C.

Examples of treatment compositions that can be used in the present invention include wafer cleaning systems that are conventional in the art, such as the SC-1 composition ($NH_4OH/ H_2O_2$/Water), the SC-2 composition ($HCl/-H_2O_2/$Water), the Piranha or SPM composition (Sulfuric Acid/ $H_2O_2$), SOM (sulfuric acid/ozone) compositions, sulfuric acid compositions, buffered oxide etch (HF and ammonium fluoride) compositions, and $NH_4OH$, $H_3PO_4$, HF, HCl, HCl/ $H_2O_2$ or HF/HCl compositions.

The processing environment of the treatment chamber can be modified by adding N2 through a port, and by adding steam through a separate port. Optionally, steam may be added through a spray bar, or through both a port and a spray bar. The treatment chamber environment can be varied by adjusting the steam and $N_2$ operating pressures, thereby changing the quantity of each component added to the treatment chamber.

EXAMPLES

Representative embodiments of the present invention will now be described with reference to the following examples that illustrate the principles and practice of the present invention.

Example 1

A semiconductor wafer having oxide on a surface thereof was provided in a treatment chamber. In a control process, a hot ammonium hydroxide/$H_2O_2$/water mixture (APM-1:1: 30) was applied to the wafer in a 60s, center dispense process, with introduction of $N_2$ through a port at 20 psi. This control exhibited an oxide etch that is was approximately 1 angstrom faster at the center than it is at the edge. See the data labeled "APMN2" in FIG. 1.

The same process as described above was carried out in an environment of steam and $N_2$, whereby $N_2$ was introduced through a port at 20 psi and steam was introduced through a spray bar at 20 psi boiler pressure. In this inventive process, the difference in etch rate from the center to the edge of the wafer essentially disappeared. See the data labeled "APM-BOTH" in FIG. 1.

While not being bound by theory, the inventive process can be better understood through the use of the following contemplative examples:

Example 2

Figure 2:
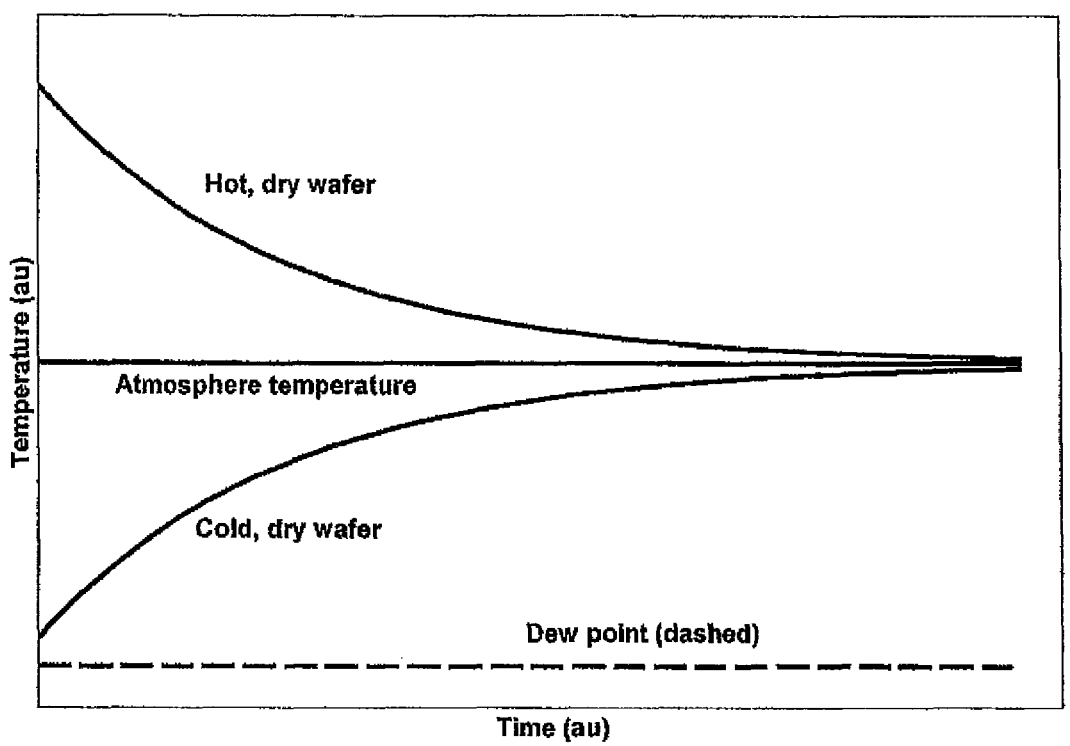
FIG. 2 is a graph showing the equilibration of dry wafers to the atmospheric temperature in a relatively dry atmosphere.

FIG. 2 shows the temperature profiles of a cold wafer that is placed in a dry atmosphere at the target temperature. Radiative, and particularly convective heat transfer mechanisms heat the wafer until it equilibrates at the target temperature. However, as these mechanisms are slow, the temperature of the initially cold wafer approaches the target temperature only slowly. (For brevity, only the convective mechanism will be mentioned in further discussions.) FIG. 2 also shows the slow cooling of an initially hot wafer to the target temperature. The procedure of FIG. 2 is commonly used in the semiconductor industry and is not an embodiment of the present invention.

Example 3

Figure 3:
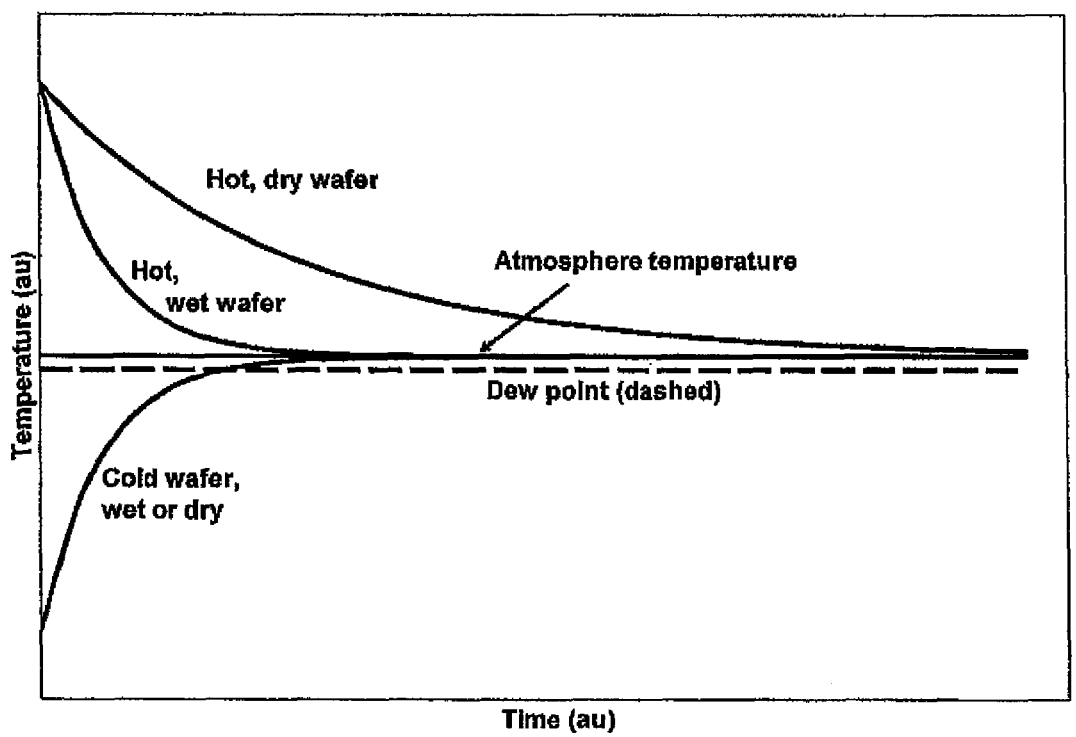
FIG. 3 is a graph showing the equilibration of wet and dry wafers in an atmosphere where the dew point is near the atmospheric temperature (near saturation).

FIG. 3 represents the most desirable embodiments of the current invention. FIG. 3 shows the effect of liquid and vaporous water on the heating and cooling process when the atmospheric temperature and the dew point are at the target temperature (typically the dispense temperature of the treating liquid). The temperature profile of an initially hot, dry wafer from FIG. 2 is repeated for reference. No water vapor condenses or evaporates from the initially hot, dry wafer, so the heat transfer mechanisms of the present invention are not active.

By comparison, FIG. 3 also shows the temperature profile of an initially hot, wet wafer (bulk water on the wafer surface) that is introduced into an atmosphere at the target temperature and dew point. The liquid water evaporates, and the heat of vaporization of the water rapidly cools the wafer towards the target temperature. However, as the wafer temperature nears the dew point of the atmosphere, the evaporation, and its associated cooling, ceases. Therefore, the temperature of the initially hot, wet wafer rapidly reaches the target temperature, but does not overshoot below the target temperature. Heat removed by the evaporating water cools the wafer to the target temperature much more quickly than does convection alone.

FIG. 3 also shows the result of introducing a cold wafer, either dry or wet, into an atmosphere at the target temperature and dew point. As the wafer temperature is below the dew point, water vapor will condense onto the wafer, depositing the vapor's heat of vaporization, rapidly heating the wafer to the target temperature. However, as the wafer temperature nears the dew point, condensation, and its associated heating, ceases. Therefore, the temperature of the initially cold, wet or dry wafer rapidly reaches the target temperature, but does not overshoot above the target temperature. Heat added by the condensing water heats the wafer to the target temperature much more quickly than does convection alone.

The heating of an initially cold, wet or dry wafer, and the cooling of an initially hot, wet wafer in an atmosphere where the temperature and dew point of the atmosphere are matched to the target temperature of the wafer represent the most desirable embodiments of the current invention. While only described utilizing water, it is contemplated that the liquid-vapor equilibrium of other liquids could be used to control temperature. For instance, ethylene glycol (boiling point 198° C.) could be used to process at temperatures above 100° C. at atmospheric pressure. Elevated processing temperatures could also be supported using water at elevated pressures.

Example 4

Figure 4:
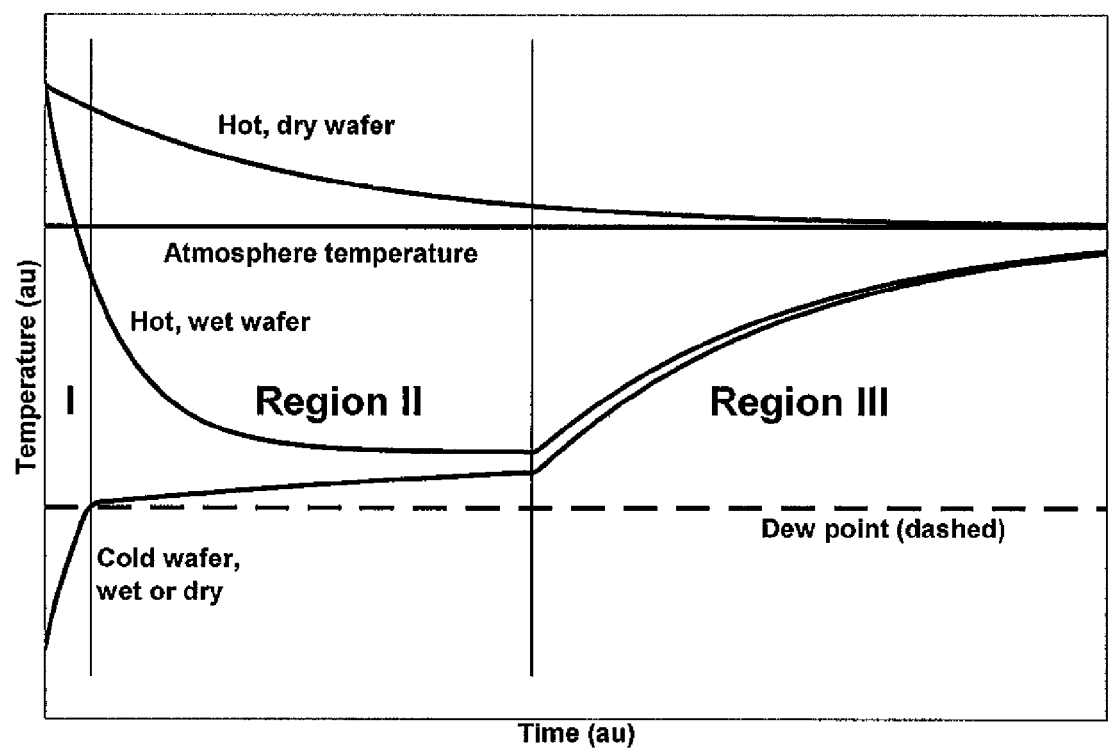
FIG. 4 is a graph showing the equilibration of wet and dry wafers in an atmosphere where the dew point is below the atmospheric temperature (below saturation).

FIG. 4 shows less desirable embodiments of the current invention. Ideally, the temperature and dew point of the atmosphere matches the target temperature of the wafer. As the dew point diverges from the target temperature, the temperature regulating effects of condensation and evaporation lessen. While having the atmospheric temperature and dew points near the target temperature represent an embodiment of the present invention, this is less desirable than when they are at the target temperature. FIG. 4 illustrates the result when the dew point is well below the target temperature. The temperature profile of an initially hot, dry wafer from FIG. 2 is repeated for reference.

In FIG. 4, an initially hot, wet wafer cools rapidly by evaporation in Region I. Unfortunately; the low dew point allows evaporation to continue into Region II, where the evaporative cooling cools the wafer to an equilibrium temperature below the target temperature. Evaporation continues through Region II until all water has evaporated from the wafer. In Region III, the now dry wafer is slowly heated by convection towards the target temperature. The amount of thermal undershoot depends on the local rate of evaporation, with surfaces receiving large fluxes of dry gas cooling more quickly, and to a lower temperature, than surfaces in relatively stagnant gas flow. This results in non-uniform temperatures, and hence non-uniform chemical treatment, across the surface of the wafer.

FIG. 4 also shows the temperature profile of an initially cold wafer. Whether initially wet or dry, in Region I water condenses on the cold wafer, heating it rapidly until it reaches the dew point. Above the dew point, the situation reverses, and the evaporating water slows further heating. Only when all of the water has evaporated from the wafer does the temperature climb to the target temperature (Region III.) Again, variations in the local gas flow can cause significant variations in temperature and hence variations in the activity of the chemical treatment.

A situation like that in FIG. 4, but with the atmospheric temperature and dew point far from the target temperature, does not represent an embodiment of the present invention. However, a situation like FIG. 4, but with the atmospheric temperature and dew point near the target temperature, represents a less desirable, but still potentially useful, embodiment of the current invention. It is believed, for instance, that the inventive process used in during the "APMBOTH" process example of FIG. 1 represent a situation where the atmospheric temperature and dew point were somewhat above the target temperature (the temperature of the dispensed treating chemical) resulting in somewhat excessive chemical action near the edges of the wafer where the gas flow is highest. However, the non-ideal conditions still resulted in a significantly more uniform treatment than that of the comparative "APMN2" process example of FIG. 1, where no control of the water vapor in the atmosphere was attempted.

All percentages and ratios used herein are weight percentages and ratios unless otherwise indicated. All patents, patent applications (including provisional applications), and publications cited herein are incorporated by reference as if individually incorporated for all purposes. Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

What is claimed is:

1. A process for treating a semiconductor wafer at a target wafer temperature, comprising
    a) determining the target wafer temperature of the semiconductor wafer during a given wafer treatment process step;
    b) providing a treatment chamber having at least one semiconductor wafer disposed therein;
    c) dispensing water vapor into the treatment chamber in an amount to provide the chamber with an atmospheric environment having a dew point sufficiently, close to the target wafer temperature to provide a temperature regulating effect by allowing the temperature of the wafer to change by evaporation or condensation; and
    d) initiating the given wafer treatment process step when the atmospheric environment of the treatment chamber is at the dew point of step c).

2. The process of claim 1, wherein the dew point is within about 20° C. of the target wafer temperature.

3. The process of claim 1, wherein the dew point is within about 10° C. of the target wafer temperature.

4. The process of claim 1, wherein the dew point is within about 5° C. of the target wafer temperature.

5. The process of claim 1, wherein the wafer treatment process step is initiated when the atmospheric environment of the treatment chamber is at the dew point at the target wafer temperature and when the wafer is at the target wafer temperature.

6. The process of claim 1, wherein the at least one semiconductor wafer is at a temperature below the target wafer temperature prior to dispensing water vapor into the treatment chamber.

7. The process of claim 1, wherein the atmospheric environment of the treatment chamber is at a temperature within the target wafer temperature.

8. The process of claim 1, wherein the atmospheric environment of the treatment chamber is at a temperature that is higher than the target wafer temperature.

9. The process of claim 1, wherein the dew point at the target wafer temperature is achieved by dispensing fully saturated water vapor into the treatment chamber until the dew point at the target wafer temperature within the treatment chamber is reached.

10. The process of claim 1, wherein the water vapor is steam at a temperature of about 100° C.

11. The process of claim 1, wherein the dew point at the target wafer temperature is achieved by dispensing less than fully saturated water vapor into the treatment chamber until the dew point at the target wafer temperature within the treatment chamber is reached.

12. The process of claim 11, wherein the water vapor comprises nitrogen gas.

13. The process of claim 1, wherein the at least one semiconductor wafer is at a temperature above the target wafer temperature prior to dispensing water vapor into the treatment chamber, the wafer comprising liquid aqueous composition on the wafer surface, and the wafer is allowed to cool to the desired target temperature.

14. A process for treating a semiconductor wafer at a target wafer temperature, comprising
   a) determining the target wafer temperature of the semiconductor wafer during a given wafer treatment process step;
   b) providing a treatment chamber having at least one semiconductor wafer disposed therein;
   c) dispensing vapor into the treatment chamber in an amount to provide the chamber with an atmospheric environment having a dew point sufficiently close to the target wafer temperature to provide a temperature regulating effect by allowing the temperature of the wafer to change by evaporation or condensation; and
   d) initiating the given wafer treatment process step when the atmospheric environment of the treatment chamber is at the dew point of step c).

\* \* \* \* \*

UNITED STATES PATENT AND TRADEMARK OFFICE
CERTIFICATE OF CORRECTION

Page 1 of 1

PATENT NO. : 8,142,571 B2
APPLICATION NO. : 12/436465
DATED : March 27, 2012
INVENTOR(S) : Christenson et al.

It is certified that error appears in the above-identified patent and that said Letters Patent is hereby corrected as shown below:

Figure 2
should contain legend -- PRIOR ART --

Column 2, Line 29
"stalts" should be -- starts --

Column 2, Line 62
"a compared" should be -- as compared --

Column 6, Line 40
"that is was" should be -- that was --

Column 8, Line 59
"sufficiently, close" should be -- sufficiently close --

Signed and Sealed this
Third Day of July, 2012

David J. Kappos
*Director of the United States Patent and Trademark Office*